(12) United States Patent
Tihanyi

(10) Patent No.: US 6,169,441 B1
(45) Date of Patent: *Jan. 2, 2001

(54) DRIVE CIRCUIT FOR A FIELD EFFECT-CONTROLLED POWER SEMICONDUCTOR COMPONENT

(75) Inventor: Jenoe Tihanyi, Kirchheim (DE)

(73) Assignee: Siemens Aktiengesellschaft, Munich (DE)

(*) Notice: Under 35 U.S.C. 154(b), the term of this patent shall be extended for 0 days.

This patent is subject to a terminal disclaimer.

(21) Appl. No.: 09/151,887

(22) Filed: Sep. 11, 1998

(30) Foreign Application Priority Data

Sep. 11, 1997 (DE) .............................. 197 39 999

(51) Int. Cl.⁷ ................................ H03K 17/687
(52) U.S. Cl. .................. 327/427; 327/546; 323/277; 361/79
(58) Field of Search .................... 327/375, 376, 327/377, 427, 430, 431, 434, 546, 374, 389, 384; 323/277; 361/79, 101, 103

(56) References Cited

U.S. PATENT DOCUMENTS

| | | | |
|---|---|---|---|
| 5,500,619 | * 3/1996 | Miyasaka | 327/427 |
| 5,506,539 | * 4/1996 | Kelly et al. | 327/379 |
| 5,801,573 | * 9/1998 | Kelly et al. | 327/434 |
| 6,019,263 | * 1/2000 | Tihanyi | 327/374 |

FOREIGN PATENT DOCUMENTS 0 882661 * 2/1998 (EP) .

* cited by examiner

Primary Examiner—Timothy P. Callahan
Assistant Examiner—Hai L. Nguyen
(74) Attorney, Agent, or Firm—Schiff Hardin & Wait

(57) ABSTRACT

A voltage source provides an input signal to a drive circuit for a power semiconductor. A protective circuit is connected between the drain and the source of the power semiconductor and is activated when excess current is present. The protective circuit provides an output signal that is received by a control circuit to limit the voltage at the gate of the power semiconductor. The control circuit is connected between the gate and the source. A controllable resistance including an enhancement MOSFET and an external capacitor in which the enhancement MOSFET has a gate, a source and an internal capacitance between the gate and the source is connected in parallel to the external capacitance. The controllable resistance carries the input signal from the voltage source to the power semiconductor. The controllable resistance is switched to high impedance when the protective circuit is activated and switched to low impedance when the protective circuit is deactivated.

8 Claims, 2 Drawing Sheets

DRIVE CIRCUIT FOR A FIELD EFFECT-CONTROLLED POWER SEMICONDUCTOR COMPONENT

BACKGROUND OF THE INVENTION

The invention is directed to a drive circuit for a field effect-controlled power semiconductor component.

Drive circuits for metal oxide semiconductor field-effect transistors (MOSFETS) is known. One example of such a drive circuit is disclosed in European Patent Document No. EP 0 822 661. In this example, a control resistor (depletion MOSFET) is switched to high-impedance when the protective circuit is activated and is switched to low-impedance when the protective circuit is deactivated. This depletion MOSFET has an internal gate-source capacitance that, given a positive drive signal at the control input post, charges the drive voltage at the input post and, thus, switches the control resistor, (e.g. the depletion MOSFET) to low-impedance. This condition is maintained as long as the circuit functions normally and no excess current is present. However, if an overload or a short circuit occurs, the excess current limiting circuit is activated. When the current limiting circuit is activated it discharges the internal gate-source capacitance of the depletion MOSFET.

The above-described drive circuit requires a shortened turn-on time during normal operation in comparison to other circuit arrangements. The drive circuit limits the gate-source voltage of the power semiconductor component when a short circuit occurs.

Another example is U.S. Pat. No. 5,506,539. This drive circuit discloses a field-effect controlled power semiconductor component with a controllable resistor that includes two resistors R3, R5 and a transistor Q2. A drive signal is supplied to the gate of the power semiconductor component. The drive circuit also includes a controllable component in the form of a power MOSFET Q4, that serves the purpose of limiting the gate voltage of the power semiconductor component. The MOSFET is connected between the gate and the source terminal of the power semiconductor component. The drive circuit further contains a protective circuit 10 that drives the MOSFET Q4 when a non-normal condition of the power semiconductor component 2 occurs. The controllable resistor is switched to high-impedance when the protective circuit is activated or is switched to low-impedance when the protective circuit is deactivated. The controllable resistor of the drive circuit thereby contains an enhancement MOSFET Q2.

Additionally, German Specification DE 39 36 544 A1 discloses a circuit arrangement for applications involving a short-circuit of a load that is in series with a power MOSFET. In this example, the drain-source voltage is compared to a reference voltage. When a predetermined value is exceeded, a switch that is positioned between the gate and the source terminal is turned on, this switch discharges the gate-source capacitance of the power MOSFET. At the same time, the switch drives a controllable resistor into a region of a higher impedance reducing the load current of the gate-source capacitance.

SUMMARY OF THE INVENTION

An object of the present invention is to improve a drive circuit for a field effect controlled power semiconductor including a drive signal, a controllable resistor and a protective current limiting circuit.

Another object is to provide a drive circuit arrangement that can be applied both in low-side switches as well as high-side switches.

Another object of the invention is to provide a drive circuit arrangement that can be incorporated in integrated circuit technology.

The present invention provides a drive circuit arrangement for use with field effect controlled power semiconductor component technology.

To this end, in an embodiment of the present invention, a drive circuit includes a voltage source that provides an input signal to the circuit arrangement, a field-effect power semiconductor having a gate, a source and a drain and a protective circuit connected between the drain and the source, the protective circuit is activated when an over voltage is present and provides an output signal. A control circuit receives the output signal from the protective circuit and limits the over voltage at the gate of the power semiconductor. The control circuit is connected between the gate and the source of the power semiconductor. A controllable resistance including an enhancement MOSFET and an external capacitor in which the enhancement MOSFET has a gate and a source and an internal capacitance between the gate and the source. The external capacitor and the internal capacitance are connected in parallel. As a result, the controllable resistance carries the input signal from the voltage source to the power semiconductor so that the controllable resistor is switched to high impedance when the protective circuit is activated and switched to low impedance when the protective circuit is the deactivated.

In an embodiment, an ohmic resistor is connected in parallel to the controllable resistance.

In another embodiment, a switching circuit is connected to the controllable resistance. The switching circuit switches the enhancement MOSFET to low impedance during normal conditions.

In a still further embodiment, the switching circuit includes a resistor and a diode connected in series between the drain and the gate of the enhancement MOSFET.

In another embodiment, the switching circuit includes a second enhancement MOSFET. The second enhancement MOSFET in connected between the drain and the gate of the enhancement MOSFET in the controllable resistance.

In another embodiment, the control circuit includes an enhancement MOSFET and the enhancement MOSFET is driven by the protective circuit and is connected between the gate of the enhancement MOSFET of the controllable resistance and ground.

In a still a further embodiment, the switching circuit is a resistor and a diode connected between the voltage source and the gate of the enhancement MOSFET.

In a still further embodiment, the switching circuit is an enhancement MOSFET whose load path is connected between the voltage source and the gate of the enhancement MOSFET. The enhancement MOSFET of the switching circuit includes a gate that is connected to the voltage source.

These and other objects or advantages of the present invention are described in and are set forth below in the following detailed description of presently preferred embodiments and from the drawings.

DETAILED DESCRIPTION OF THE DRAWINGS

Figure 1:
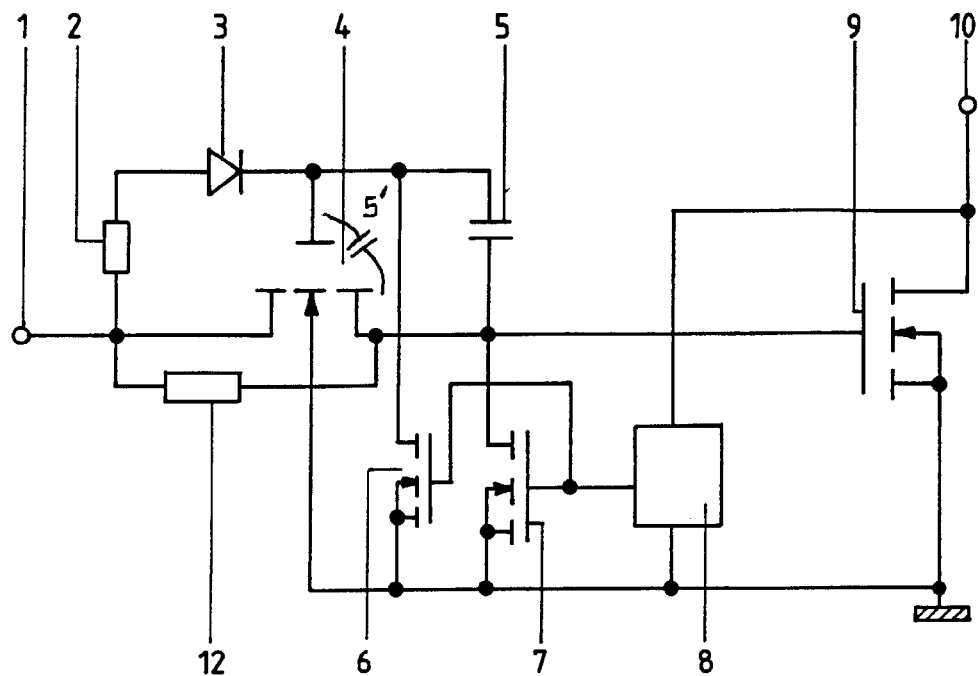
FIG. 1 is a circuit diagram of an embodiment of an inventive circuit arrangement.

FIG. 1 shows a circuit arrangement where a voltage source $V_s$ provides a drive signal at an input post 1. The input post 1 is connected to a gate 9a of a power MOSFET 9 via a load path or an enhancement MOSFET 4. The input post 1 is also interconnected with a gate 4a of the enhancement MOSFET 4 via a resistor 2 and a diode 3 connected in series in the direction of current flow. The gate of the enhancement MOSFET 4 is connected to ground via the load path of an enhancement MOSFET 6. A substrate terminal of the enhancement MOSFET 4 is also connected to ground. Additionally, a resistor 12 is connected between a drain 4b and a source 4c of the enhancement MOSFET 4. A gate-source capacitance 5' of the enhancement MOSFET 4 is shown with broken lines. An external capacitance 5 is connected in parallel to the gate-source capacitance 5'.

A protective circuit 8 taps the voltage between a drain 9b and a source 9c of the power MOSFET 9. The protective circuit 8 generates an output signal that is supplied to a gate 6a of the enhancement MOSFET 6 as well as to a gate 7a of another enhancement MOSFET 7. The load path of the MOSFET 7 is connected between the gate terminal 9a of the power MOSFET 9 and ground. In the present embodiment, the power MOSFET 9 is a low-side switch whose drain terminal 9b is connected to a terminal post 10 and whose source terminal 9c is connected to ground.

Generally, a positive drive signal (and drive voltage) at the input post 1 charges both the gate capacitance 5' of the enhancement MOSFET 4 and the external capacitance 5 via the diode 3 switching the enhancement MOSFET 4 to low-impedance. This condition is maintained as long as the circuit operates normally and no excess current is present.

The principle of this drive circuit is that a controllable resistance is switched high-impedance or low-impedance depending on whether the status of the protective circuit is active or inactive. The controllable resistance is utilized as a series resistor. The controllable resistance is switched to high-impedance if a short circuit occurs. As a result, the gate-source voltage at the power semiconductor element can be reduced via a suitable switching circuit and, thus, the short-circuit current is limited. Preferably, the controllable resistance can only be switched low-impedance when a corresponding drive signal is present.

If an over current (e.g. short circuit) occurs, the protective current limiting circuit 8 is activated and drives both the MOSFET 6 and the MOSFET 7. As a result, the MOSFET 6 is switched transmissive and discharges the gate capacitance 5 of the enhancement MOSFET 4. The impedance of the load path of the enhancement MOSFET 4 is increased as a result of this measure, and the current limitation of the power MOSFET 9 is now activated. To this extent, the MOSFET 7 is switched transmissive and reduces the gate-source voltage of the power MOSFET 9.

Figure 2:
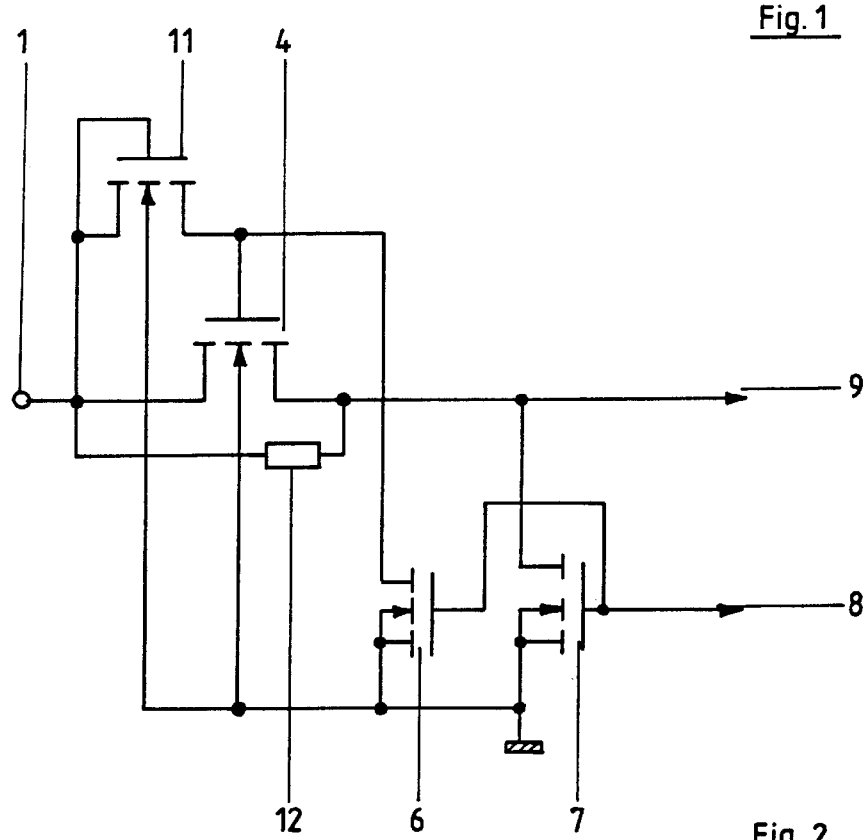
FIG. 2 is a circuit diagram of another embodiment of the inventive circuit arrangement wherein only the relevant circuit elements are shown.

FIG. 2 shows another embodiment of the resistor 2 and the diode 3 according to FIG. 1. All other components in FIG. 2 correspond to those according to FIG. 1, however the elements 8, 9 and 10 are not shown in FIG. 2 for purposes of simplicity. According to FIG. 2, the resistor 2 and the diode 3 are replaced with an enhancement MOSFET 11. The load path is connected between a voltage supply post 1 and a gate terminal 4a of the enhancement MOSFET 4. The gate terminal 11a of the MOSFET 11 is connected to the input post 1. The substrate terminal of the MOSFET 11 is connected to ground.

Figure 3:
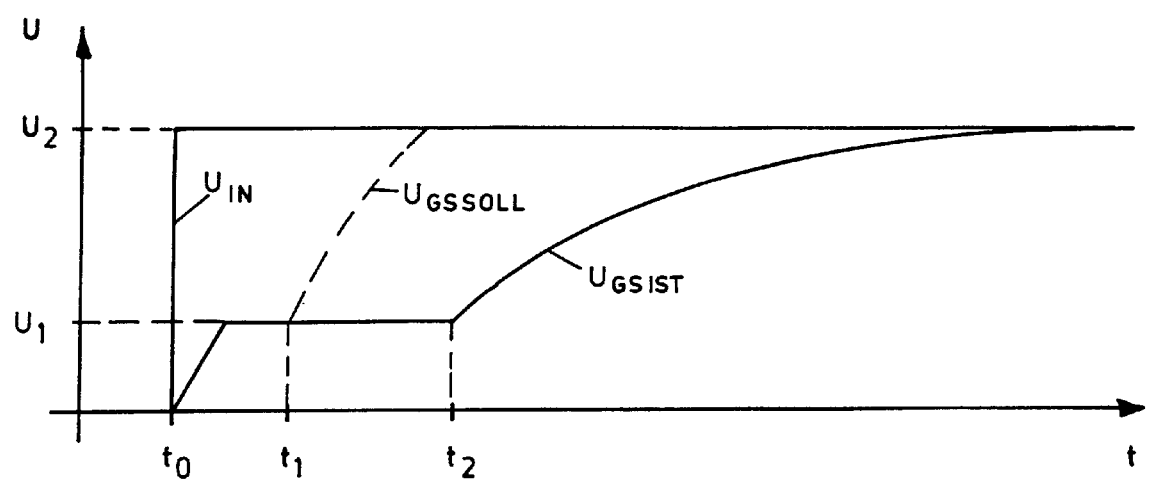
FIG. 3 is a graph of a time curve of the control signal adjacent at the input post 1 as well as the gate-source voltage with and without the inventive circuit arrangement.

The effect that this circuit arrangement has on the switching behavior of the power MOSFET is illustrated in FIG. 3. The input voltage from the drive signal $U_{IN}$ is applied to the input terminal post 1 at time $t_0$. The curve of the gate-source voltage at the power MOSFET 9 given a circuit arrangement according to the examples described in the Background of the Invention is shown by the course of the curve $U_{GSIST}$. The voltage first rises to a medium value $U_1$ and at time $t_2$ begins to approach the voltage $U_2$ (which essentially corresponds to the input voltage $U_{IN}$) with a curve like an E-function.

FIG. 3 shows the curve of the gate-source voltage $U_{GSSOL}$ at the power MOSFET given the inventive circuit arrangement. In contrast to the previous curve $U_{GSIST}$, the gate-source voltage at the power MOSFET 9 now rises quickly at a time $t_1$ that lies between the time $t_0$ and the time $t_2$ and thus approaches the actual final value $U_2$ considerably earlier.

The invention can be applied both in low-side switches according to FIG. 1 or in high-side switches as in FIG. 2. In these applications the gate impedance of the power MOSFET (e.g. the load path of the enhancement MOSFET 4) is low impedance during normal operation and high impedance in the case of a short circuit. The invention can also be applied in integrated circuit technology.

It is seen that this invention provides a novel circuit arrangement for providing a drive circuit for a field-effect controlled power semiconductor component. It should be understood that various changes and modifications to the presently preferred embodiments described herein will be apparent to those skilled in the art. Such changes and modifications may be made without departing from the spirit and scope of the present invention and without diminishing its attendent advantages. It is, therefore, intended that such changes and modifications be covered by the appended claims.

What is claimed is:

1. A drive circuit arrangement, comprising:
   a voltage source providing an input signal;
   a field-effect power semiconductor having a gate, a source and a drain;
   a protective circuit connected between the drain and the source, the protective circuit being activated when an over current is present and provides an output signal;
   a control circuit receives the output signal and limits a voltage level at the gate, the control circuit being connected between the gate and the source of the field-effect power semiconductor;
   a controllable resistance including an enhancement MOSFET and an external capacitor, the enhancement MOSFET having a MOSFET gate, a MOSFET source and an internal capacitance between the MOSFET gate and the MOSFET source wherein the external capacitor and the internal capacitance are connected in parallel; and
   the controllable resistance carries the input signal from the voltage source to the power semiconductor, the controllable resistance being switched to high impedance when the protective circuit is activated and being switched to low impedance when the protective circuit is deactivated.

2. The drive circuit arrangement of claim 1, further comprising: an ohmic resistor is connected in parallel to the controllable resistance.

3. The drive circuit arrangement of claim 1, further comprising:

a switching circuit connected to the controllable resistance, the switching circuit switches the enhancement MOSFET to low impedance during normal conditions.

4. The drive circuit arrangement of claim 3, wherein the switching circuit further comprises a resistor and a diode connected in series between the drain and the gate of the enhancement MOSFET.

5. The drive circuit arrangement of claim 3, wherein said enhancement MOSFET is a first enhancement MOSFET, and the switching circuit comprises a second enhancement MOSFET, the second enhancement MOSFET being connected between the drain and the gate of the first enhancement MOSFET in the controllable resistance.

6. The drive circuit arrangement of claim 1, wherein the control circuit further comprises a second enhancement MOSFET, the second enhancement MOSFET is driven by the protective circuit and being connected between the gate of the first enhancement MOSFET of the controllable resistance and ground.

7. The drive circuit arrangement of claim 3, wherein the switching circuit is a resistor and a diode being connected between the voltage source and the gate of the enhancement MOSFET.

8. The drive circuit arrangement of claim 3, wherein said enhancement MOSFET is a first enhancement MOSFET, and the switching circuit is a second enhancement MOSFET whose load path is connected between the voltage source and the gate of the first enhancement MOSFET, the second enhancement MOSFET of the switching circuit having a gae being connected to the voltage source.

* * * * *